United States Patent [19]

Waldner

[11] Patent Number: 4,926,677
[45] Date of Patent: May 22, 1990

[54] DIE APPARATUS

[76] Inventor: Kurt Waldner, 12260 Saraglen Dr., Saratoga, Calif. 95170

[21] Appl. No.: 128,291

[22] Filed: Dec. 3, 1987

[51] Int. Cl.$^5$ .............................................. B21J 15/24
[52] U.S. Cl. ....................................... 72/430; 72/707; 83/575; 100/917
[58] Field of Search ...................... 72/430, 707, 453.03, 72/453.08, 453.13, 453.14; 83/575, 170, 102; 100/917, 256

[56] References Cited

U.S. PATENT DOCUMENTS

| | | |
|---|---|---|
| 1,491,657 | 4/1924 | Barnett . |
| 1,582,217 | 4/1926 | Henry . |
| 1,684,296 | 9/1928 | Brodsky . |
| 1,895,401 | 1/1933 | Simonsen . |
| 2,155,578 | 4/1939 | Anderson ............................ 164/49 |
| 2,441,517 | 5/1948 | Sussman ............................. 72/430 |
| 2,509,956 | 5/1950 | Benoit ................................ 164/94 |
| 2,539,902 | 1/1951 | Foley ................................. 164/86 |
| 2,825,406 | 3/1958 | Hagopian ........................... 164/113 |
| 2,951,437 | 9/1960 | Diener ............................... 100/256 |
| 3,029,676 | 4/1962 | Rabinow ............................ 83/575 |
| 3,486,400 | 12/1969 | Westmijze .......................... 77/32.9 |
| 3,644,932 | 2/1972 | Wallace et al. .................... 346/77 |
| 3,709,083 | 1/1973 | Doherty ............................. 83/575 |
| 3,730,039 | 5/1973 | Fedrigo ............................. 83/170 |
| 3,783,662 | 1/1974 | Keller et al. ...................... 72/430 |
| 4,022,090 | 5/1977 | Doherty ............................. 83/162 |
| 4,126,069 | 11/1978 | Shimonaka ........................ 83/575 |
| 4,703,644 | 11/1987 | Waldner ............................ 72/430 |
| 4,735,303 | 4/1988 | Wallis ............................... 72/405 |
| 4,809,535 | 3/1989 | Ellis ................................. 72/453.08 |

FOREIGN PATENT DOCUMENTS 0223120 12/1984 Japan ..................................... 72/430

Primary Examiner—David Jones
Attorney, Agent, or Firm—Townsend & Townsend

[57] ABSTRACT

Apparatus and a method for processing work pieces, such as semiconductor lead frames, wherein the apparatus includes a power device such as a solenoid assembly, for driving an upper die into processing relationship to a work piece on a lower die with the stroke of the power device being relatively short, such as in the range of 0 to 0.375 inch. This is achieved by providing a second power device, such as a piston and cylinder assembly, in which the piston rod of the assembly raises the upper die high enough to allow clearance between the dies for the passage of the work piece between the dies, then the second power device is allowed to lower relatively slowly until the upper die is substantially in proximity to the work piece. When this occurs, the first power device is ready to be actuated and, when so actuated, moves a relatively short distance during the power stroke to process the work piece between the dies with a minimum of noise because of the greatly reduced distance of travel of the power device during the power stroke. In this way, the apparatus is more effectively used in the presence of one or more workmen so that there will be no injury to their hearing because of the greatly reduced noise levels associated with the improved die apparatus of the present invention.

19 Claims, 9 Drawing Sheets

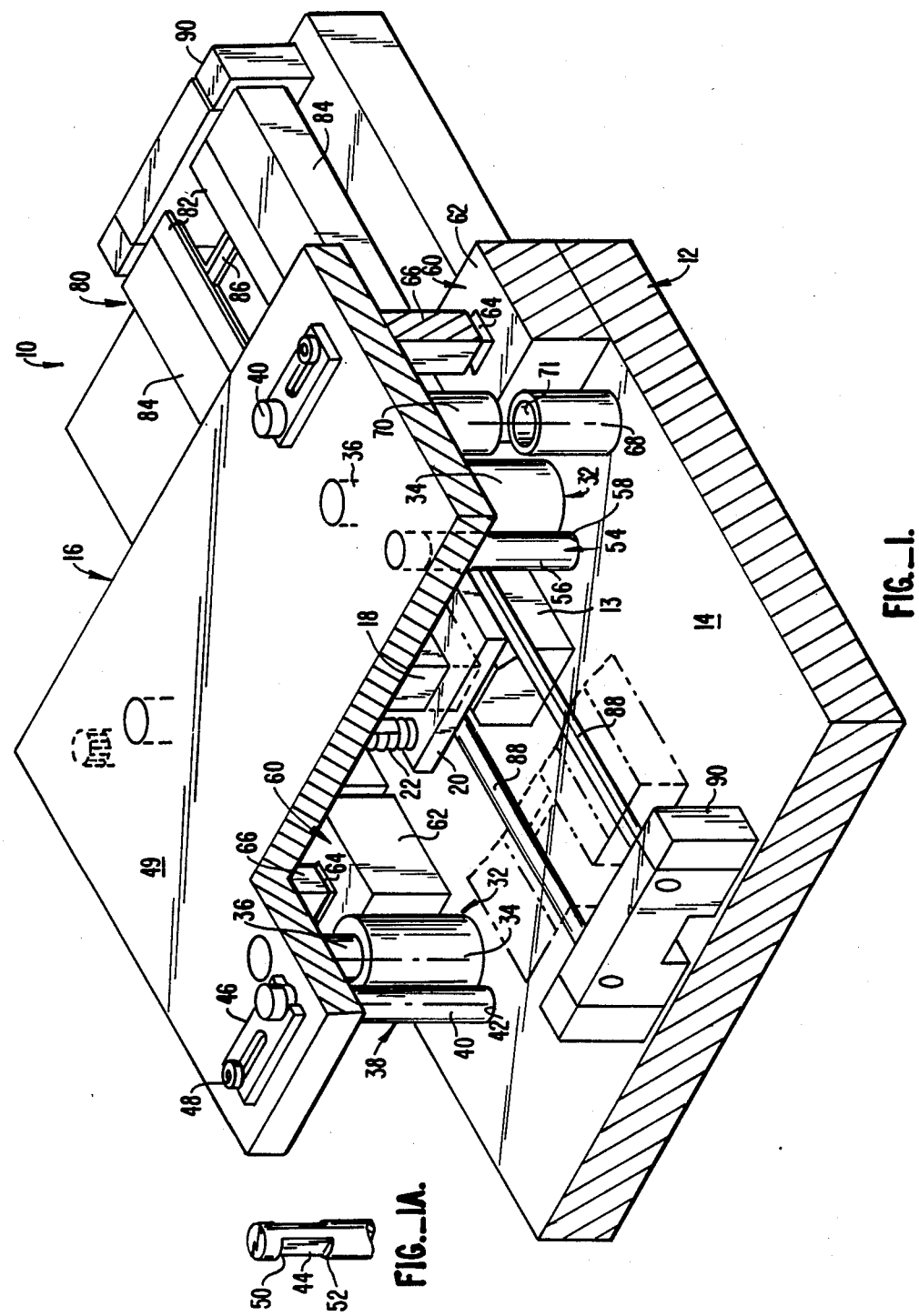

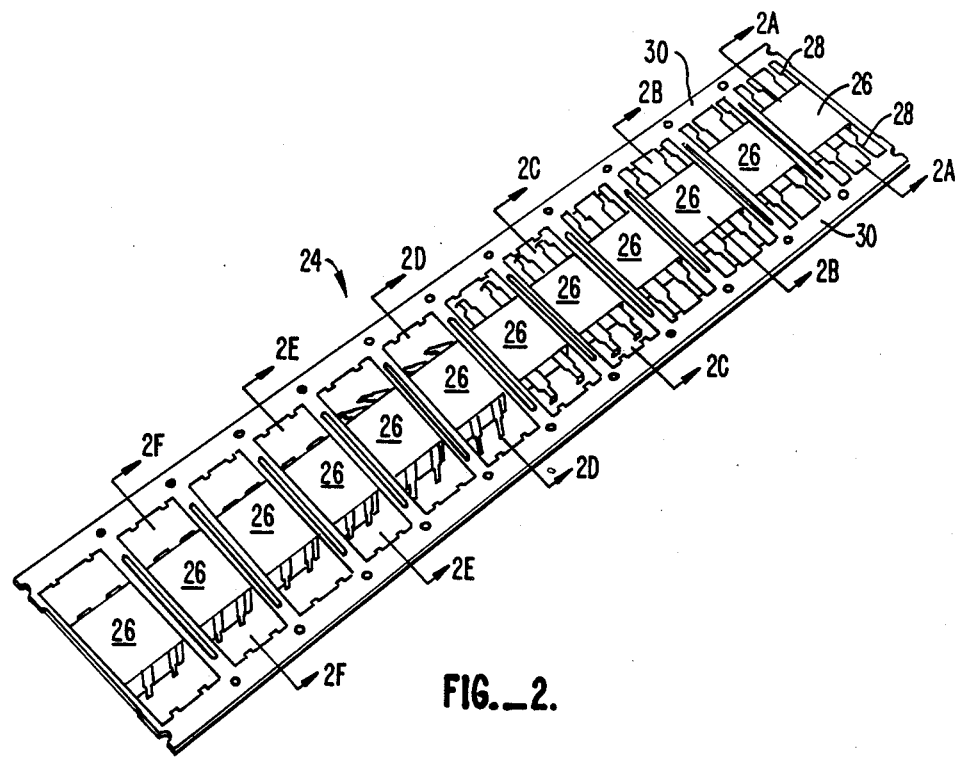
FIG._2.
FIG._2A.
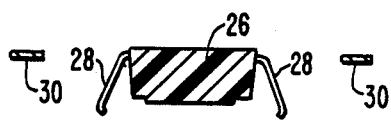
FIG._2D.
FIG._2B.
FIG._2E.
FIG._2C.
FIG._2F.

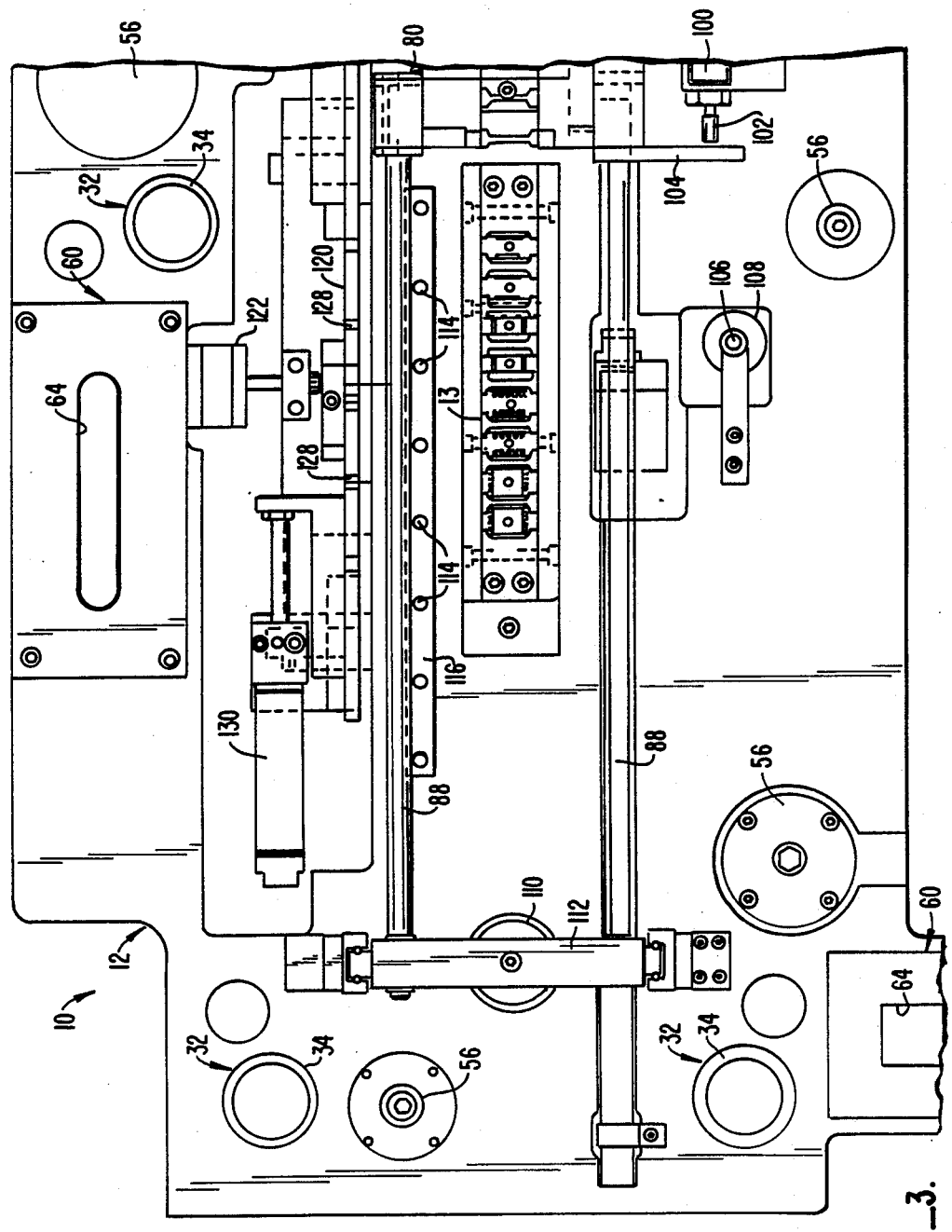
FIG._3.

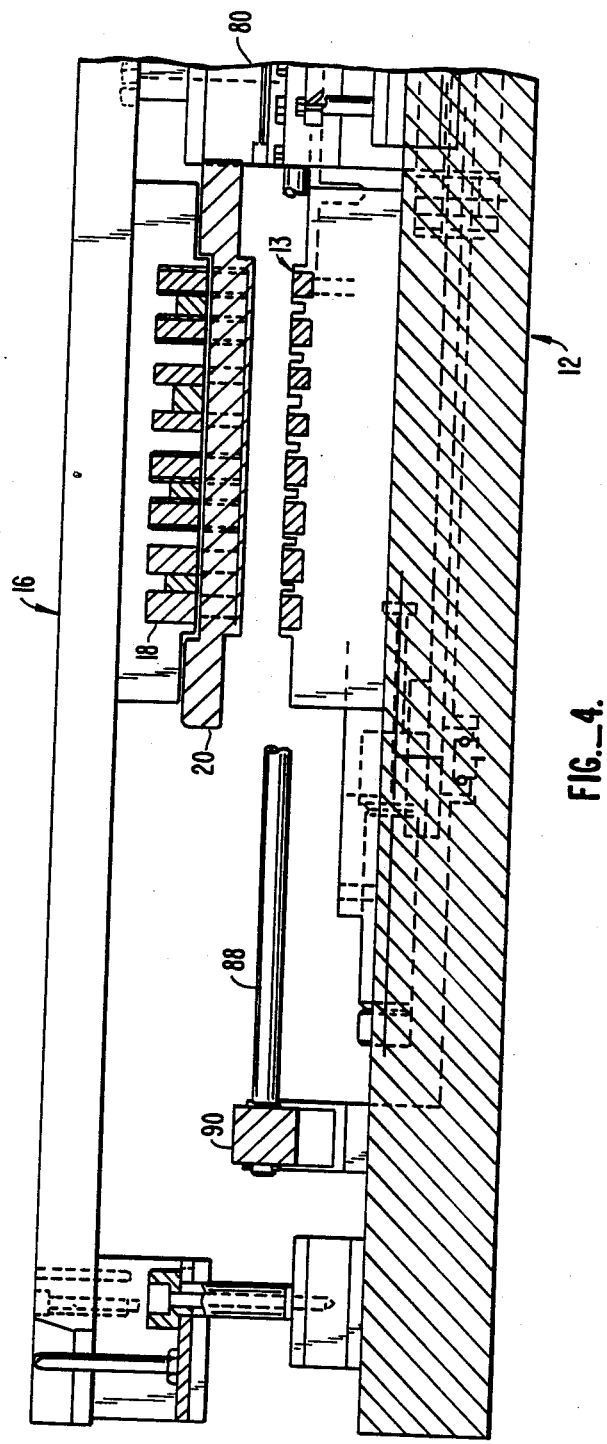
FIG._4.

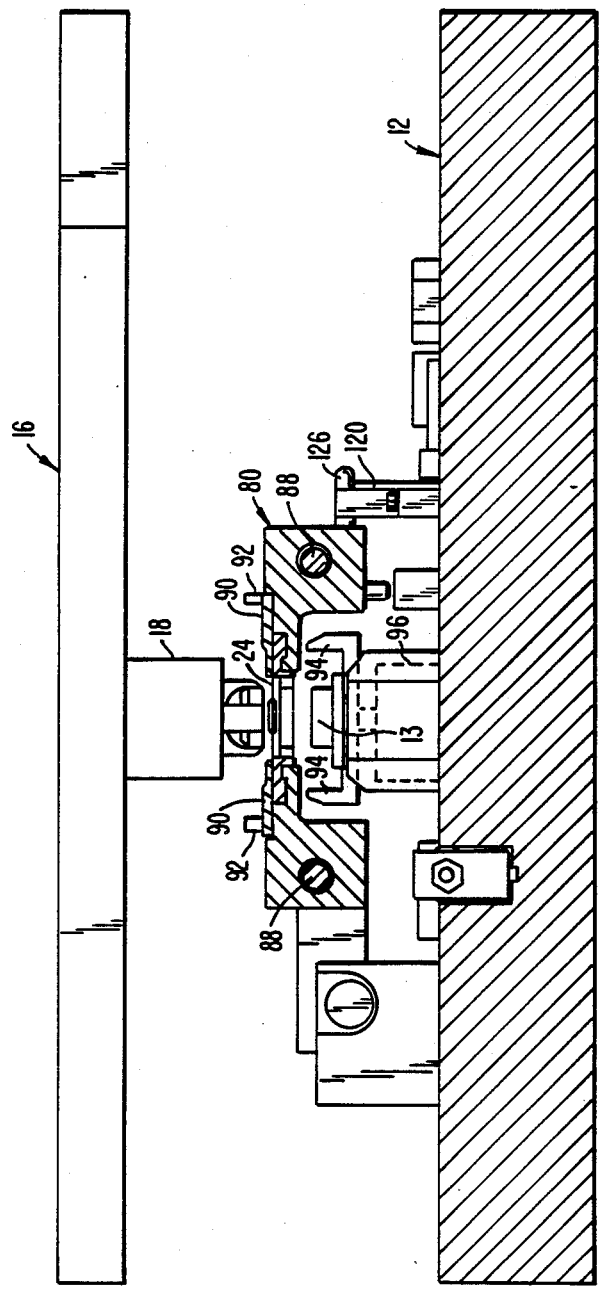
FIG._5.

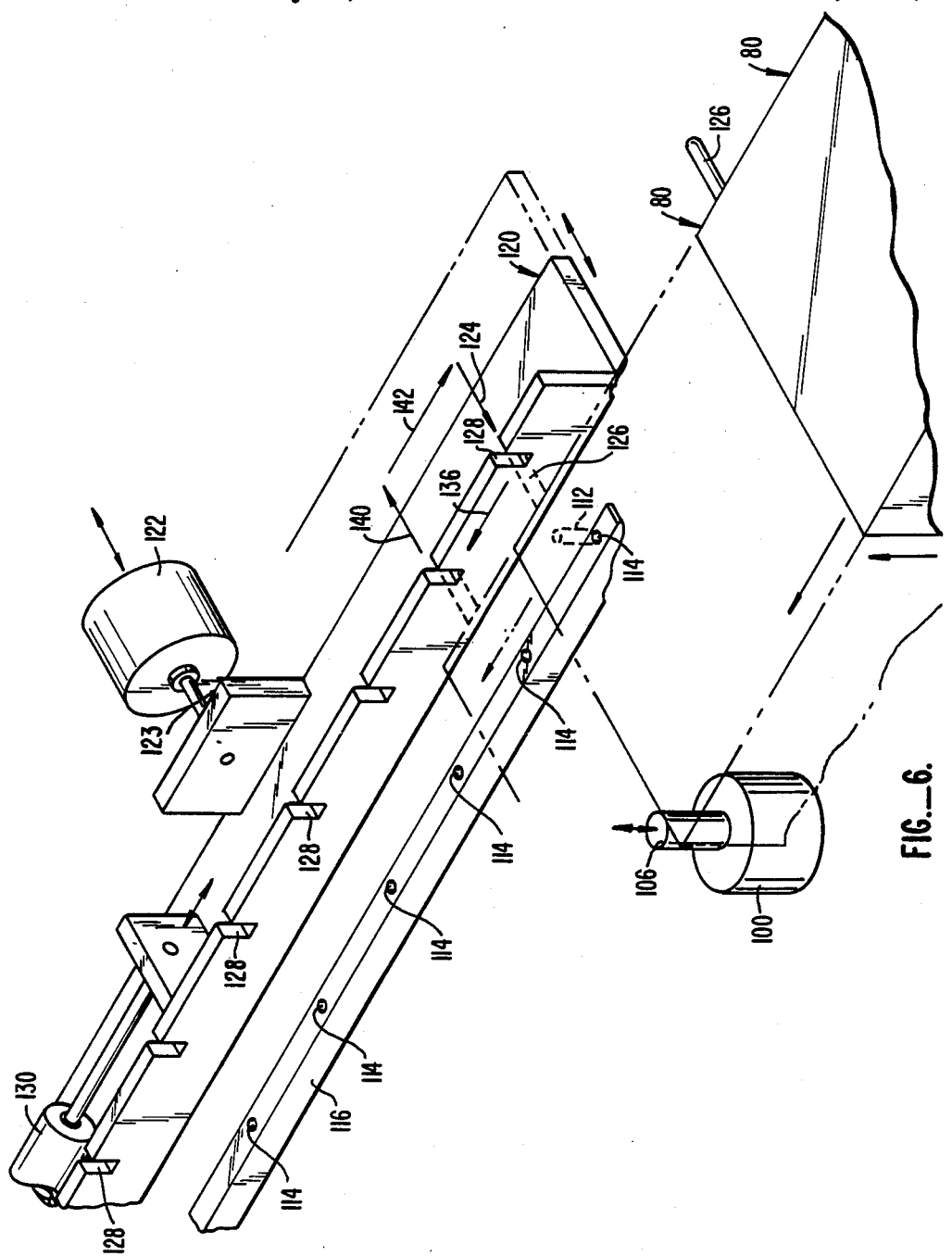

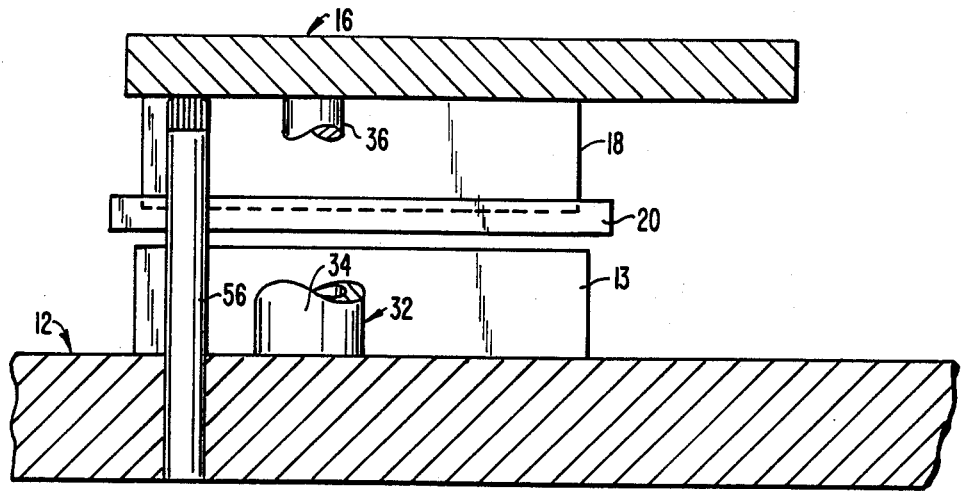
FIG._7.
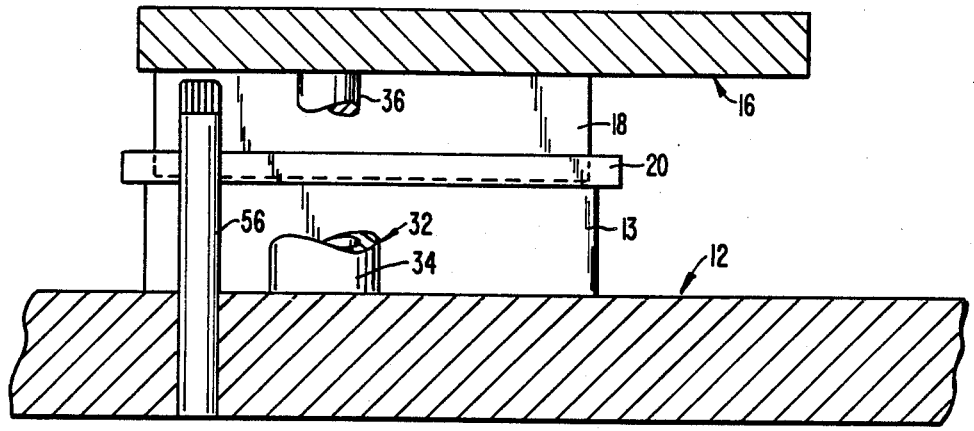
FIG._8.
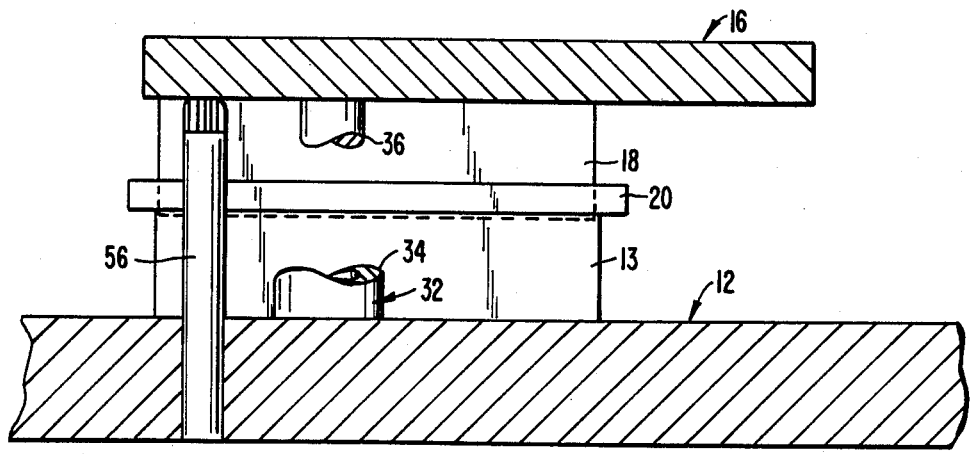
FIG._9.

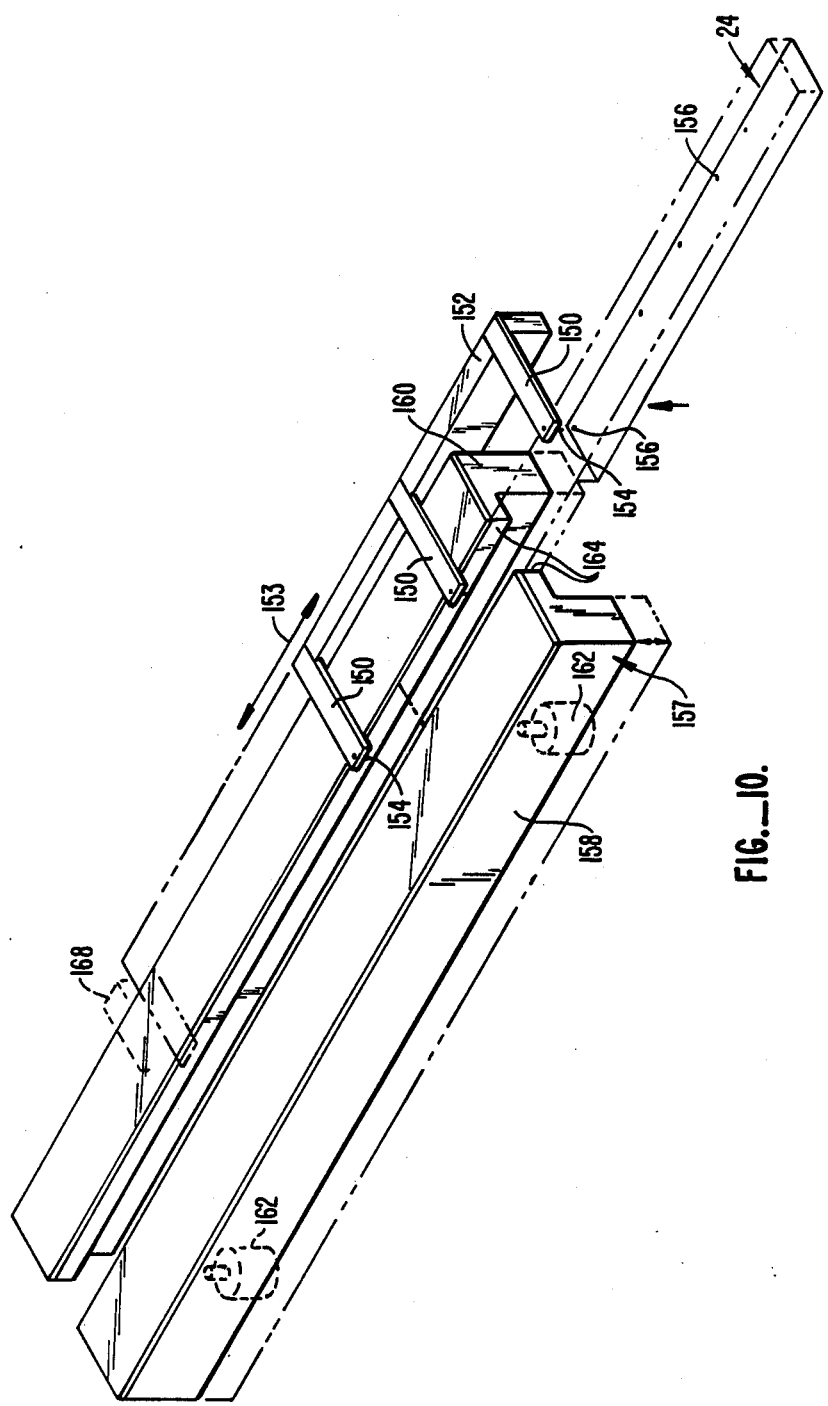
FIG._10.

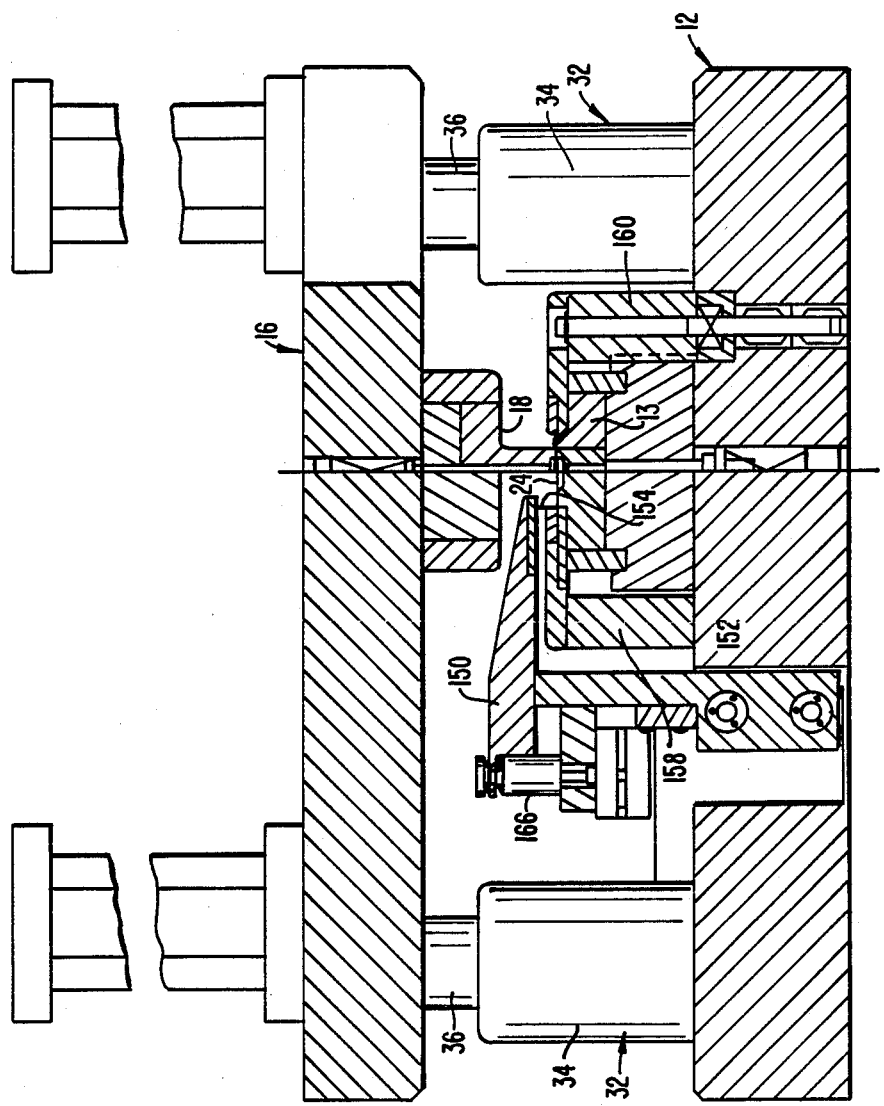
FIG._11.

DIE APPARATUS

This invention relates to improvements in the processing of work pieces with dies and, more particularly, to an improved apparatus and method for processing a work piece between a pair of relatively shiftable upper and lower dies.

BACKGROUND OF THE INVENTION

In the die processing of work pieces, such as semiconductor lead frames, a work piece is moved between an upper die and a lower die when the dies are spaced apart. Then the upper die typically is moved downwardly in a power stroke a certain distance, such as 1 to 2 inches, into processing relationship with the work piece in which the work piece is subjected to the upper and lower dies to perform certain functions, such as cutting, bending, twisting and the like. Generally, such a die apparatus uses a stop unit such as an upper post aligned with a lower post so that, when the upper post collides with the lower post, the upper die movement is stopped. This collision or impact of the upper stop hitting the lower stop causes an impact which is deafening in some situations and is clearly to be avoided because it is injurious to the hearing of a worker standing nearby. Thus, the need exists to avoid this noise by an apparatus which operates in a manner which eliminates this noise without sacrificing the productivity of the dies themselves. The present invention satisfies this need.

SUMMARY OF THE INVENTION

The present invention is directed to apparatus and a method for processing work pieces, such as semiconductor lead frames, wherein the apparatus includes a power device such as a solenoid assembly, for driving the upper die into processing relationship to a work piece on a lower die with the stroke of the power device being relatively short, such as in the range of 0 to 0.375 inch. This is achieved by providing a second power device, such as a piston and cylinder assembly, in which the piston rod of the assembly raises the upper die high enough to allow clearance between the dies for the passage of the work piece between the dies, then the second power device is allowed to lower until the upper die is substantially in proximity to the work piece. When this occurs, the first power device is ready to be actuated and, when so actuated, moves a relatively short distance in the power stroke to process the work piece between the dies with a minimum of noise because of the greatly reduced distance of travel of the power device during the power stroke. In this way, the apparatus is more effectively used in the presence of one or more workmen so that there will be no injury to their hearing because of the greatly reduced noise levels associated with the improved die apparatus of the present invention.

The primary object of the present invention is to provide an improved apparatus and method for the die processing of work pieces in which the work piece is moved between a pair of spaced dies and then the dies are moved relative to and toward each other into processing relationship with the work piece, all of which occurs without causing a great amount of noise which is deafening and injurious to the hearing of workmen around the apparatus.

Another object of the present invention is to provide an improved apparatus and method for the type described wherein the processing of work pieces can occur by moving an upper die into proximity to the work piece with a lower die beneath the work piece and then moving the upper die through a power stroke of relatively short distance into processing relationship to the work piece to thereby minimize the noise caused by the impact of the upper die on the work piece through die stops following the processing of the work piece.

Other objects of this invention will become apparent as the following specification progresses, reference being had to the accompanying drawings for illustration of the invention.

IN THE DRAWINGS:

FIG. 1 is a perspective view, partly broken away and in sections, of the die apparatus of the present invention;

FIG. 1A is a perspective view of a shock absorber for the apparatus of FIG. 1;

FIG. 2 is a perspective view of a semiconductor lead frame which is processed with the use of the apparatus of FIG. 1;

FIGS. 2A–2F are cross-sectional views taken along lines 2A—2A, 2B—2B, 2C—2C, 2D—2D, 2E—2E and 2F—2F of FIG. 2.

FIG. 3 is a top plan view of the die apparatus of FIG. 1 with the top plate removed;

FIG. 4 is a vertical section through the die apparatus of FIGS. 1 and 3;

FIG. 5 is a vertical section looking in the direction of one end of the die apparatus;

FIG. 6 is a perspective view, partly schematic, of the carrier for the lead frame of FIG. 2, showing the way in which the carrier is advanced incrementally in one direction to move the lead frame between a lower die and an upper punch;

FIGS. 7, 8 and 9 are enlarged, fragmentary cross-sectional views of the upper and lower die plates of the apparatus of FIG. 1, showing the way in which the punch on the upper die plate is lowered onto the lead frame and then powered further downwardly through a short distance to process the lead frame during the power stroke;

FIG. 10 is a view similar to FIG. 6 but showing a second embodiment of the means for moving the lead frame beneath the punch and above the lower die; and FIG. 11 is a view similar to FIG. 5 but showing the carrier of FIG. 10 in cross-section.

The die apparatus of the present invention is broadly denoted by the numeral 10 and includes a lower die plate 12 having a lower die 13 (FIG. 1) mounted on the upper surface 14 thereof. Apparatus 10 further includes an upper die plate 16 which carries a punch or upper die 18 above and in alignment with die 13. A stripper 20 is carried by springs 22 on upper die plate 16 below the lower surface thereof and below punch 18. Stripper is to be used to strip a work piece from contact with punch 18 after the punch has been lowered into processing relationship to the work piece and then elevated away from the work piece to allow the work piece to be advanced in a certain direction relative to punch 18.

Die apparatus 10 can be used with any suitable work piece for processing the same by the interaction of lower die 13 and punch 18. For purposes of illustration, the work piece can take the form of a semiconductor lead frame 24 of the type having a plurality of semiconductor components 26 secured by leads 28 to side rails 30 (FIG. 2). Again, for purposes of illustration, the interaction of the lower die 13 and punch 18 causes certain functions to be performed on the leads 28 so that the leads can be cut from the side rails 30 and bent in a particular manner as hereinafter described.

FIG. 2A shows a semiconductor component 26 with two of its leads 28 integral with side rails 30. FIG. 2B shows the leads 28 after they have been severed from side rails 30. FIG. 2C shows the severed leads 28 being curled downwardly at the ends thereof. FIG. 2D shows the leads 28 as they are bent at there inner ends to an angle of approximately 60° from the vertical. FIG. 2E shows the leads extending substantially vertically with the curled outer ends tucked underneath the bottom surface of the component 26. FIG. 2F shows leads 28 snugly against adjacent side surfaces of the components with the curled outer ends of the lead in position for soldering on a printed circuit board.

All of the functions performed on leads 28 as illustrated in FIGS. 2B-2F are performed by the lowering of punch 18 toward and onto the work piece resting on die 13 with each lowering of the die punch causing a particular function to be performed on the work piece itself. Moreover, since there are multiple components 26 on lead frame 24 as shown in FIG. 2, two or more sets of lead frames 28 can be simultaneously processed. For instance, since there are 10 components on lead frame 24 and since there are five different processing steps as illustrated in FIGS. 2B-2F, two of the lead sets 28 can be processed simultaneously. Moreover, incremental advancement of the work piece past lower die 13 and punch 18 is sufficient to process the lead frame segments simultaneously. As a pair of the segments are processed by first portions of the dies, second and possibly third, fourth and fifth segments are processed by other portions of the die and punch.

A pair of spaced guide posts 32 are carried between die plates 12 and 16 as shown in FIG. 1. Each guide post includes a lower, open top cylinder 34 secured to and extending upwardly from the upper surface 14 of lower plate 12, the cylinder adapted to receive a rod 36 secured to and extending downwardly from the lower surface of die plate 16. The guide posts 36 keep the die punch 18 properly aligned with lower die 13.

At least a pair of shock absorbers 38 are provided for absorbing the shock of movement of the upper die plates 16 relative to the die plate 12. Each shock absorber 38 includes a piston rod 40 slideably received within a cylinder (not shown) located below the plate 12 with rod 40 passing through a hole 42 in the lower plate 12. The upper end of the rod 40 is provided with a recess 44 (FIG. 1A) which receives a stop member 46 (FIG. 1) secured by a screw 48 to the upper surface 49 of top plate 16. The upper shoulder 50 of recess 44 serves as a stop system for limiting the upward movement of the die plate 16 as it lifts upwardly. The lower shoulder 52 serves the same purpose when the die plate 16 moves downwardly. The shock absorber 38 absorbs the shock of movement of the upper die plate 16 relative to the lower die 12.

Means for moving the die plate upwardly relative to lower die plate 12 includes a pair of fluid power devices 54 with each power device having a piston 56 extending upwardly through a hole 58 in die plate 12 from a cylinder (not shown) beneath die plate 12. The upper end of piston rod 56 is adapted to engage the underside of the upper plate 16 for moving the same from a position in which the die 18 is in processing relationship to a work piece carried on lower die 13 to a position in which the stripper 20 is above the die plate to allow the work piece to be shifted laterally relative to lower die 13 along a predetermined path. By allowing piston rod 56 to be lowered, this permits lowering of the die plate 16 until stripper 20 engages die 13.

For moving the die plate 16 downwardly in a power stroke, a pair of solenoid devices 60 are provided between die plates 12 and 16. Each solenoid device 60 includes a coil 62 having a central opening 64 for receiving an armature 66 secured to and depending from the upper die plate 16. Each device 62 is powered or actuated under the influence of control means (not shown) when die plate 16 has been lowered and stripper 20 is resting on the work piece supported by lower die 13.

A pair of stop members 68 and 70 are secured to and extend vertically from lower and upper die plates 12 and 16, respectively, as shown in FIG. 1. A urethane stop element 71 is carried by member 68 to deaden the sound caused by the power stroke when devices 60 are actuated. The mere fact that the power stroke is relatively short, such as of the order 0 up to 0.375 inch, means that the sound will be deadened; otherwise, if the stroke were longer, the impact of upper member 70 on lower member 68 of the stop means would cause a loud, undesirable noise.

The operation of die apparatus 10 is as follows:

When die plate 16 is in the up position, a work piece can be placed between the dies either manually or by automatic feeding system as hereinafter described. The upper plate 16 is then lowered by allowing piston rods 56 to move downwardly under the weight of the upper die plate 16 until stripper 20 is resting on the top of the work piece to be punched. The stripper will be approximately 0.000 up to about 0.375 inch from the punch. The stripper is spring loaded. Die stop 68 is used to control the depth or entry of the punch into the die. Inside the bottom half of the die stop, a die spring can be inserted which can would control the downstroke of the top die plate to a predetermined height before the press will be fired.

Thus, when firing the press through means of an electrical power supply coupled to power devices 60, the press will not come down with a tremendous speed more than ⅜ inch and will not make a tremendous impact noise which is above 85 to 90 decibels. This is illustrated in FIGS. 7-9 wherein FIG. 7 shows the upper die plate moved by piston rod 56 to an up position in which the stripper 20 is above the lower die 13 to allow the work piece to pass between the stripper and the lower die. FIG. 8 shows the stripper resting on the lower die and on the work piece supported by the lower die also. The piston rod 56 is lowered below the lower surface of upper die plate 16, following which the power stroke is exerted, causing the upper die to move only a relatively short distance into processing relationship with the work piece and then the gap between the upper end of the piston rod 56 and the lower surface of upper die 16 is 0.

The means for incrementally advancing the work piece can take any form of an automatic feeding system. One embodiment of the feeding system is shown in FIGS. 1, 3-6. To this end, the feeding system includes a work piece carrier 80 having means 82 for releasably holding a work piece 24 on the carrier. As shown in FIG. 1, the carrier 80 includes a pair of parallel bars 84 which are secured together at the ends thereof by cross pieces 86 and the bars are slideable along respective, parallel guide rails 88 (FIG. 1) which are secured by supports 90 near the outer peripheral margins of lower plate 12; thus, carrier 80 can slide along the path defined by guide rails 88 relative to lower die 13.

As shown in FIG. 5, a work piece 24 is clamped between a pair of plate like elements 90 which are spring biased by springs 92 inwardly toward each other so as to force themselves against the outer edges of the work piece. To move the elements 90 apart to gain access to and remove the work piece from the carrier, a pair spaced fingers 94 are carried by a piston and cylinder assembly 96 and provided with beveled upper ends as shown in FIG. 5 for entering holes (not shown) in elements 90 to spread the same away from each other and to allow separation of the work piece 24 from the carrier.

Carrier 80 is moved incrementally from the right hand end of guide rails 88 when viewing FIG. 1 to the left hand end. Carrier 80 is shown in full lines at the right hand end of guide rails 88 and is shown in dashed lines at the left hand end of the guide rails 88. At each station of the work piece carrier 80, punch 18 lowered by lowering rods 56 until stripper 20 rests on the work piece as shown in FIG. 8. Then, the power devices 16 are energized to cause movement of the punch through a minimum of distance, such as 0 to 0.375 inch to process the work piece, such as to cut or form the lead frames in the manner shown in FIG. 2A through 2F.

To move the carrier 80 from its starting position to its first station, a fluid piston cylinder assembly 100 (FIG. 3) is actuated to cause a piston rod 102 to force a bar 104 and thereby carrier 80 to the left when viewing FIG. 3 until the bar 104 strikes a stop 106 which is a rod on a power device 108 carried by support 12. The cylinder 100 and cylinder 108 are only used to move the carrier 80 to the first station. Thereafter, cylinders 100 and 108 are not used.

During the movement of the carrier, upper plate 16 is held elevated by pistons 56 so as to provide clearance for the movement of carrier 80 to the first station. During this time, rails 88 are elevated by the actuation of fluid power devices 110, only one of which is shown in FIG. 3, each power device 110 being coupled to a cross piece 112 which is, in turn, coupled to guide rails 88 to raise and lower the same. The purpose of elevating the carrier 80 to move it from one station to another is because the carrier as shown in FIG. 6, has a locater pin 112 extending downwardly therefrom which is adapted to be received within holes 114 in a bar 116 secured to the upper surface of plate 12. At each station, pin 112 is lowered into the respective hole 114 when the rails are lowered into position by the deactuation of cylinders 110 (FIG. 3). This locates the carrier 80 and thereby lead frame 24 with respect to lower die 13 and upper punch 18.

At the first station an L-shaped rail 120 (FIG. 6) is shiftably mounted on the upper surface of plate 12 is moved by a fluid power device 122 into the position and direction of arrow 124 (FIG. 6) so that a drive pin 126 extending laterally from the side of carrier 80 will enter a notch 128 in the vertical part of rail 120 to permit movement of carrier 80 to the next station when pin 126 is in a notch 128.

The operation of rail 120 is as follows:

As soon as the carrier 80 strikes pin 106 (FIG. 6) carrier 80 is allowed to lower so that locator pin 112 enters the corresponding hole 114 to properly align die 13 with upper punch 18. Then, power device 122 is energized to move rail 120 toward the carrier 80 so that pin 126 will enter the aligned notch 128. Then, the punch 18 is lowered until the stripper 20 rests on the work piece. Then the power stroke is energized, processing the work piece, the upper plate 16 is raised, a power device 130 is energized to move the rail 120 and carrier 80 along a path in the direction of arrow 136 (FIG. 6) after the carrier 80 has been elevated to lift pin 112 out of the corresponding hole 114. As rail 120 moves from the direction of arrow 136, the carrier 80 is moved by virtue of pin 126 being in slot 128 of rail 120. Thus, the rail 120 moves the carrier 80 to the next station. Then pin 112 is allowed to be lowered into the next hole 114 while the piston rod 123 of power device 122 is retracted, causing rail 120 to move in the direction of arrow 140 (FIG. 6). As soon as pin 126 is out of the corresponding slot 128, power device 130 is energized to move rail 120 in the direction of arrow 142 and returns the rail 120 to its initial starting position. In such a case, rail 120 moves only in a box-like path along path segments defined by arrows 124, 136, 140 and 142. In this way, carrier 80 is incrementally advanced from one station to the other in a downstream direction starting at the right hand side of the path of travel of the carrier as shown in FIG. 1 to the left hand side.

Another way of advancing the work piece, or lead frame 24 is by the use of spaced fingers 150 which are carried by a bar 152 and which project inwardly from the bar as shown in FIG. 10. Each finger has a pin 154 on its inner end and each pin is adapted to enter a hole 156 in the side rails 130 of lead frame 24.

The carrier 157 for the embodiment of FIGS. 10 and 11 includes a pair of spaced side bars 158 and 160, the fingers being near bar 160. The bars 158 and 160 are movable up and down together by a pair of fluid power devices 162 (FIG. 2) and the purpose of raising the carrier is to move the work piece 24 above and away from the lower die 13 (FIG. 11). Upper die punch 18 is shown in a lowered condition with only half of the punch being shown for purposes of illustration. The upper die and the lower fit into the space between the inner faces 164 of bars 158 and 160 respectively.

A fluid power device 166 (FIG. 11) is coupled with bar 152 for raising and lowering the same to cause pin 154 to enter holes 156 in the side rails 130 of work piece 24.

A fluid power device 168 is coupled with bar 152 to move the same back and forth in the direction of arrow 153. When the fingers are up, power device 168 is energized, causing each finger 154 to enter a hole 156 aligned therewith, causing the bar 152 to shift to the left when viewing FIG. 10, carrying the work piece coupled to the fingers 150 when the carrier 157 is in an elevated position. At the new station, the carrier is lowered, lowering the work piece onto the lower die 13, following which power device 168 is moved in the opposite direction causing movement of bar 152 to the right when viewing FIG. 10. In this way, the work piece is moved incrementally from station to station by fingers 158 and while the carrier 157 is in the respective position.

I claim:

1. Die apparatus comprising:
    a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means coupled with the die plates for lifting the upper die plate away from the lower die plate, said lifting means permitting the upper die plate to be lowered until the upper die is in proximity to a work piece when the work piece is substantially supported on the lower die;

actuatable power means coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke; and a pair of stop members on the die plates, one of said members having a resilient element engageable by the other stop member to deaden the sound when said power means is actuated.

2. Apparatus as set forth in claim 1, wherein the power device comprises a solenoid assembly.

3. Die apparatus comprising:

a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means coupled with the die plates for lifting the upper die plate away from the lower die plate, said lifting means permitting the upper die plate to be lowered until the upper die is in proximity to a work piece when the work piece is substantially supported on the lower die;

a pair of stop members on the die plates, one of said members having a resilient element engageable by the other stop member to deaden the sound when said power means is actuated; and a solenoid assembly including a coil having a central opening and an armature receivable within the opening, said assembly being coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke.

4. Die apparatus comprising:

a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means including a fluid actuated device coupled with the die plates for lifting the upper die plate away from the lower die plate, said lifting means permitting the upper die plate to be lowered until the upper die is in proximity to a work piece when the work piece is substantially supported on the lower die;

means coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke, the device being adjacent to said applying means; and a pair of stop members on the die plates, one of said members having a resilient element engageable by the other stop member to deaden the sound when said power means is actuated.

5. Apparatus as set forth in claim 4, wherein the fluid actuated device includes a piston and cylinder assembly having a piston rod extending outwardly from a cylinder, the upper end of the piston rod being engageable with the lower surface of the upper die plate, said piston rod being movable downwardly and out of engagement with upper die plate when the die is in proximity to the work piece whereby the power device can urge the upper die plate downwardly through a distance sufficient to move the dies into processing relationship to the work piece.

6. Apparatus as set forth in claim 5, wherein said distance is in the range of 0 to 0.375 inch.

7. Die apparatus comprising:

a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means coupled with the die plates for lifting the upper die plate away from the lower die plate, said lifting means permitting the upper die plate to be lowered until the upper die is in proximity to a work piece when the work piece is substantially supported on the lower die;

means coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke; and stop means between the upper and lower die plates for limiting the downward movement of the upper die plate relative to the lower die plate, said stop means including a pair of stop members on the die plates, one of said members having a resilient element engageable by the other stop member to deaden the sound when said power means is actuated.

8. Die apparatus comprising:

a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means coupled with the die plates for lifting the upper die plate away from the lower die plate, said lifting means permitting the upper die plate to be lowered until the upper die is in proximity to a work piece when the work piece is substantially supported on the lower die;

means coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke;

a pair of stop members on the die plates, one of said members having a resilient element engageable by the other stop member to deaden the sound when said power means is actuated; and a shock absorber between the upper and lower die plates to absorb the shock of the upper plate moving relative to the lower plate.

9. Apparatus as set forth in claim 8, wherein the shock absorber includes a fluid piston and cylinder assembly having a piston rod extending through the upper die plate and provided with a pair of spaced shoulders, and means carried by the upper die plate for engaging the shoulders to couple the piston rod to the die plate when the latter is moving upwardly or downwardly.

10. Apparatus as set forth in claim 9, wherein said shoulder engaging means includes a member having a slot for receiving the piston rod and defining a pair of spaced fingers for engaging the shoulders of the piston rod.

11. Die apparatus comprising:

a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means coupled with the die plates for lifting the upper die plate away from the lower die plate, said lifting means permitting the upper die plate to be lowered until the upper die is in proximity to a work piece when the work piece is substantially supported on the lower die;

means coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke;

a pair of stop members on the die plates, one of said members having a resilient element engageable by the other stop member to deaden the sound when said power means is actuated; and a guide post assembly between the upper and lower die plates for guiding the upper die toward and away from the lower die.

12. Die apparatus comprising:

a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means coupled with the die plates for lifting the upper die plate away from the lower die plate, said lifting means permitting the upper die plate to be lowered until the upper die is in proximity to a work piece when the work piece is substantially supported on the lower die;

means coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke;

a pair of stop members on the die plates, one of said members having a resilient element engageable by the other stop member to deaden the sound when said power means is actuated; and means for incrementally advancing a work piece into the space between the upper and lower die.

13. Apparatus as set forth in claim 11, wherein said advancing means includes a carrier for the work piece, means coupled with carrier for moving the carrier in one direction in a series of steps with work piece being carried successively to a number of work stations represented by each step of travel of the carrier.

14. Apparatus as set forth in claim 13, wherein is included means on the carrier for releasably holding the work piece thereon as the carrier is advanced incrementally along said path.

15. Apparatus as set forth in claim 11, wherein the advancing means includes a work piece carrier movable up and down with respect to the lower die, and finger means adjacent to the carrier means for movement longitudinally of the path of travel of the work piece along the carrier.

16. Apparatus as set forth in claim 15, wherein said finger means includes a number of spaced fingers, and a bar secured to first ends of the fingers, the opposite end of each finger having a pin for insertion into a guide hole in the work piece to advance the work piece along said path in response to the movement of the bar longitudinally of the path, and means coupled with the bar for shifting the same longitudinally of said path.

17. Die apparatus comprising:

a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means coupled with the die plates for lifting the upper die plate away from the lower die plate, said lifting means permitting the upper die plate to be lowered until the upper die is in proximity to a work piece when the work piece is substantially supported on the lower die;

a solenoid assembly including a coil having a central opening and an armature receivable within the opening, the armature being secured to and extending downwardly from the bottom surface of the upper die plate, said coil being secured to and extending upwardly from the upper surface of the lower die plate; and said assembly being coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke.

18. Die apparatus comprising:

a pair of vertically spaced die plates, the lower plate adapted to mount a lower die and the upper plate adapted to mount an upper die aligned with the lower die, whereby the dies will perform at least one function on a work piece between the dies when the die plates move relative to and toward each other;

means coupled with the die plates for lifting the upper die plate away from the lower die plate, said lifting means permitting the upper die plate to be lowered until the upper die is in proximity to a work piece when the work piece is substantially supported on the lower die;

means coupled with the die plates for applying a downward force on the upper die plate when the upper die is in proximity to the work piece so that the upper die is moved further downwardly in processing relationship to the work piece, whereby the power stroke of said power device is relatively short to thereby minimize the noise associated with the power stroke;

a carrier for incrementally advancing a work piece into the space between the upper and lower die, and means selectively coupling with said carrier for moving the carrier in one direction in a series of steps with work piece being carried successively to a number of work stations represented by each step of travel of the carrier, said carrier moving means including a rail having a number of spaced open top slots therein, said carrier having a side facing said rail and carrying a lateral pin, said pin being receivable in one of the open top slots when the rail is coupled with said side of the carrier, whereby the rail is coupled with the carrier, and means for moving the rail longitudinally of the path of travel of the carrier to move the rail through a predetermined distance from one station to the next station.

19. Apparatus as set forth in claim 19, wherein said carrier has a lower surface, and wherein is included a locator pin located on the lower surface, there also being a bar located on the lower die plate, said bar having a pair of spaced holes for successively receiving the locator pin and positioning said carrier.

* * * * *